(12) United States Patent
Kovarsky

(10) Patent No.: US 6,852,209 B2
(45) Date of Patent: Feb. 8, 2005

(54) INSOLUBLE ELECTRODE FOR ELECTROCHEMICAL OPERATIONS ON SUBSTRATES

(75) Inventor: Nicolay Kovarsky, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 138 days.

(21) Appl. No.: 10/263,563

(22) Filed: Oct. 2, 2002

(65) Prior Publication Data

US 2004/0065543 A1 Apr. 8, 2004

(51) Int. Cl.[7] .................. C25D 5/08; C25D 17/00; C25D 21/04
(52) U.S. Cl. ............. 205/148; 204/242; 204/275.1; 204/263; 204/252; 204/291; 204/292; 204/278
(58) Field of Search .............. 205/148; 204/242, 204/275.1, 263, 252, 291, 292, 278, 224 R, 266

(56) References Cited

U.S. PATENT DOCUMENTS

| 4,342,635 A | * | 8/1982 | Becker et al. ............ 204/263 |
| 6,024,856 A | | 2/2000 | Haydu et al. ............. 205/84 |
| 6,080,288 A | * | 6/2000 | Schwartz et al. ......... 204/224 R |
| 6,099,712 A | | 8/2000 | Ritzdorf et al. ........... 205/123 |
| 6,695,962 B2 | * | 2/2004 | Uzoh et al. ............... 205/148 |

OTHER PUBLICATIONS

Everplate: A Novel Production System for Copper Wafer Plating, ATOTECH (2010 4974 01–, no date.

\* cited by examiner

Primary Examiner—Donald R. Valentine
(74) Attorney, Agent, or Firm—Moser, Patterson & Sheridan

(57) ABSTRACT

An apparatus and method for plating a metal onto a substrate. The apparatus generally includes an anode electrode disposed in the electrochemical cell and a cathode electrode disposed opposite the anode electrode in the electrochemical cell. The apparatus further includes an electrode lid having more than one aperture disposed between the anode electrode and the cathode electrode, the apertures configured to electrically connect the cathode electrode and the anode electrode. The method generally includes supplying an electrolyte to a plating cell having an anode electrode, a cathode electrode disposed opposite the anode electrode and an electrode lid having more than one aperture positioned between the anode electrode and the cathode electrode, wherein supplying the electrolyte includes passing the electrolyte through the more than one aperture at a rate sufficient to prevent the upward migration of dissolved gas and applying an electrical bias to the plating cell to plate a metal from the electrolyte onto the substrate.

29 Claims, 2 Drawing Sheets

INSOLUBLE ELECTRODE FOR ELECTROCHEMICAL OPERATIONS ON SUBSTRATES

BACKGROUND OF THE INVENTION

1. Field of the Invention

Embodiments of the present invention generally relate to the removal and reduction of electrochemically evolved gases in electroplating and electropolishing systems.

2. Description of the Related Art

Metallization for sub-quarter micron sized features is a foundational technology for present and future generations of integrated circuit manufacturing processes. In devices such as ultra large scale integration-type devices, i.e., devices having integrated circuits with more than a million logic gates, the multilevel interconnects that lie at the heart of these devices are generally formed by filling high aspect ratio interconnect features with a conductive material, such as copper or aluminum. Conventionally, deposition techniques such as chemical vapor deposition (CVD) and physical vapor deposition (PVD) have been used to fill these interconnect features. However, as interconnect sizes decrease and aspect ratios increase, void-free interconnect feature fill via conventional metallization techniques becomes increasingly difficult. As a result thereof, plating techniques, such as electrochemical plating (ECP) and electroless plating, for example, have emerged as viable processes for filling sub-quarter micron sized high aspect ratio interconnect features in integrated circuit manufacturing processes.

In an ECP process sub-quarter micron sized high aspect ratio features formed on a substrate surface may be efficiently filled with a conductive material, such as copper. ECP plating processes are generally two stage processes, wherein a seed layer is first formed over the surface features of the substrate, and then the surface features of the substrate are exposed to an electrolyte solution while an electrical bias is simultaneously applied between the substrate and an anode positioned within the electrolyte solution. The electrolyte solution is generally rich in ions to be plated onto the surface of the substrate. Therefore, the application of the electrical bias causes these ions to be urged out of the electrolyte solution and to be plated as a metal on the seed layer. The plated metal, which may be copper, for example, grows in thickness and forms a copper layer that fills the features formed on the substrate surface.

In order to facilitate and control this plating process, several additives may be utilized in the electrolyte plating solution. For example, a typical electrolyte solution used for copper electroplating may consist of copper sulfate solution, which provides the copper to be plated, having sulfuric acid and copper chloride added thereto. The sulfuric acid may generally operate to modify the acidity and conductivity of the solution. The electrolytic solutions also generally contain various organic molecules, which may be accelerators, suppressors, levelers, brighteners, etc. These organic molecules are generally added to the plating solution in order to facilitate void-free super-fill of high aspect ratio features and planarized copper deposition.

Furthermore, conventional systems may utilize a soluble metal anode to provide a continuous supply of metal ions for electrolyte replenishment. However, anode dissolution has disadvantages such as undesirable side products, e.g., sludge and copper ball formation, and undesirable side effects, e.g., anode passivation, non-uniform anode dissolution, and consumption/breakdown of organic additives. Therefore, an insoluble anode may be utilized in electrochemical plating systems. However, the electrical bias applied to the anode may cause oxygen to form, thereby saturating the plating solution with oxygen and oxygen bubbles. Occasionally, when the pulse current or reverse current is applied for electroplating, both oxygen and hydrogen bubbles are formed. Oxygen and hydrogen bubbles may cause undesirable side effects, such as non-uniformity of the copper deposit distribution, formation of bubbles on the substrate, and blockage of the anode and membranes present in the plating cell. Therefore, there is a need for a method and apparatus that minimize the formation and effects of oxygen in semiconductor electroplating baths, wherein the method and apparatus addresses the deficiencies of conventional devices.

SUMMARY OF THE INVENTION

Embodiments of the invention generally relate to an electrochemical cell. An electrochemical cell generally including an anode electrode disposed in the electrochemical cell and a cathode electrode disposed opposite the anode electrode in the electrochemical cell. The electrochemical cell further includes an electrode lid having more than one aperture disposed between the anode electrode and the cathode electrode, the apertures configured to electrically connect the anode electrode and the cathode electrode.

Embodiments of the invention may further include a plating cell having an anolyte compartment and a catholyte compartment, the anolyte compartment having an insoluble anode and an anolyte solution therein, the catholyte compartment having a cathode substrate support member and a catholyte solution therein and an ion-exchange membrane disposed between the anolyte compartment and the catholyte compartment. The plating cell generally includes an anode lid having more than one aperture interconnecting the insoluble anode and the cathode substrate support member, the apertures being configured to prevent the upward migration of dissolved gases and gas bubbles.

Embodiments of the invention generally include a method for plating a metal onto a substrate. The method generally includes supplying an electrolyte to a plating cell having an anode electrode, a cathode electrode disposed opposite the anode electrode and an electrode lid having more than one aperture positioned between the anode electrode and the cathode electrode, wherein supplying the electrolyte includes passing the electrolyte through the more than one aperture at a rate sufficient to prevent the upward migration of dissolved gas and applying an electrical bias to the plating cell to plate a metal from the electrolyte onto the substrate.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof, which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
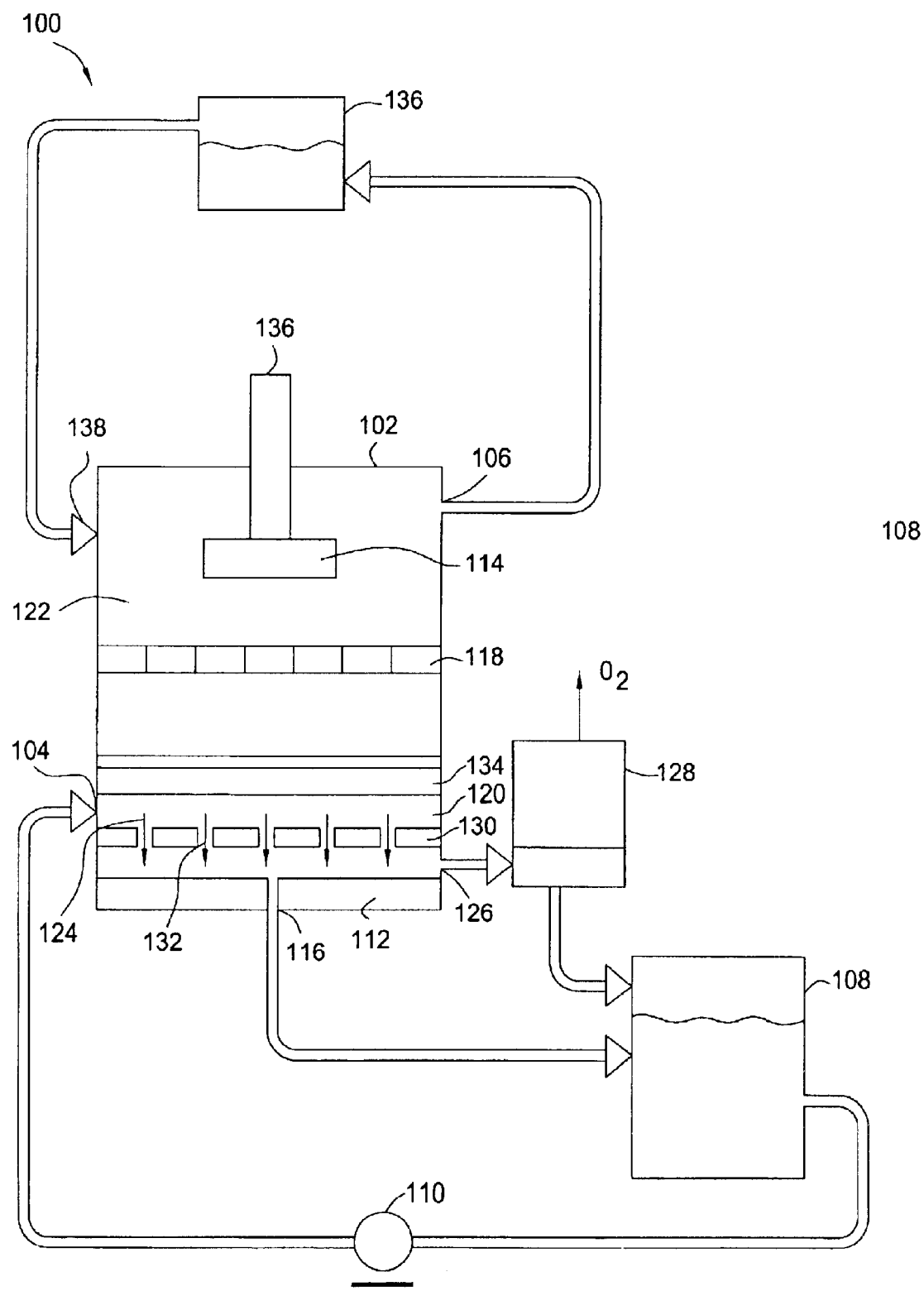
FIG. 1 illustrates a plating system for use in embodiments of the present invention.

FIG. 1 illustrates a plating system 100 for use in embodiments of the present invention. The plating system 100 may include either a plating cell, such as an electrochemical plating cell (ECP) cell, or other plating configuration known in the art. The plating system may alternatively include a removal cell, such as a chemical mechanical polishing (CMP) cell, or the plating system may include both a removal cell and a plating cell. Although either a plating system or a removal system may be utilized, the plating system will be further described in terms of an ECP cell. When utilizing a removal cell, the anode and the cathode are reversed, i.e., the substrate is the anode.

The plating cell 102 is generally configured to fluidly isolate an anode 112 of the plating cell 102 from a cathode 115 or plating electrode of the plating cell 102 via a membrane 120 positioned between the cathodic substrate 114 being plated and the anode 112 of the plating cell 102. A rotating head 136 configured to expose a substrate deposition surface to the plating solution generally supports the cathode electrode 115. Although described herein with a membrane disposed therein, embodiments of the invention contemplate utilizing a plating cell 102 without a membrane, wherein the cell 102 will contain a single plating solution composition similar to the catholyte described below. Additionally, the plating cell 102 is generally configured to provide a first (supporting) solution (anolyte) to an anolyte compartment 124, i.e., the volume between the upper surface of the anode 112 and the lower surface of the membrane 120, and a second (plating) solution (catholyte) to a catholyte compartment 122, i.e., the volume of fluid positioned above the upper membrane surface. In addition, the plating cell 102 further includes an anolyte inlet 104 configured to deliver the anolyte to the plating cell 102 and an anolyte outlet 126 configured to remove anolyte from plating cell 102.

The composition of the plating solution may vary depending on the substrate to be plated and the type of copper deposit desired. Embodiments of the invention generally employ copper plating solutions (either catholyte or anolyte) having copper sulfate at a concentration of from about 0.5 M to about 1.0 M, an acid, such as sulfuric acid, at a concentration of from about 0.1 M to about 1.0 M, and halide ions, such as chloride ions, at a concentration of from about 10 ppm to about 200 ppm, for example. The acid may include sulfuric acid, phosphoric acid, and/or derivatives thereof. In addition to copper sulfate, the plating solution may include other copper salts, such as copper fluoborate, copper gluconate, copper sulfamate, copper sulfonate, copper pyrophosphate, copper chloride, or copper cyanide, for example. However, embodiments of the invention are not limited to these parameters.

The catholyte may further include one or more additives. Additives, which may be, for example, levelers, inhibitors, suppressors, brighteners, accelerators, or other additives known in the art, typically adsorb onto the surface of the substrate being plated. Useful suppressors generally include polyethers, such as polyethylene glycol, or other polymers, such as polyethylene-polypropylene oxides, which adsorb on the substrate surface, slowing down copper deposition in the adsorbed areas. Useful accelerators generally include sulfides or disulfides, such as bis(3-sulfopropyl) disulfide, which compete with suppressors for adsorption sites, accelerating copper deposition in adsorbed areas. Useful levelers generally include thiadiazole, imidazole, and other nitrogen containing organics. Useful inhibitors typically include sodium benzoate and sodium sulfite, which inhibit the rate of copper deposition on the substrate. During plating, the additives are consumed at the substrate surface, but are being constantly replenished by the plating solution.

However, differences in diffusion rates of the various additives result in different surface concentrations at the top and the bottom of the features, thereby setting up different plating rates in high aspect ratio interconnect features in the substrate. Ideally, these plating rates should be higher at the bottom of the feature for bottom-up fill. Thus, an appropriate composition of additives in the plating solution is required to achieve a void-free fill of the features. The catholyte and the anolyte may include equivalent or different compositions, whereby the plating system 100 will include a plating cell 102 having only one plating solution inlet and the system 100 will generally include a single solution reservoir.

The anode 112 may be soluble or insoluble. Generally, the anode 112 is insoluble and is not consumed in the plating process. Suitable insoluble anodes include platinum and platinum metals including platinized titanium and niobium along with metal oxides, e.g., iridium oxide and ruthenium oxide. Other anodes may also be used in practice of the invention, e.g., lead or carbon/graphite, and generally include a Group VIII metal, such as cobalt, nickel, ruthenium, rhodium, palladium, iridium, and platinum.

The membrane 120 is generally configured to prevent anode by-products from entering the catholyte compartment 122, thereby increasing plating performance by decreasing the amount of defects present on the plated substrate. In addition, the membrane 120 generally prevents organic additive diffusion from the catholyte compartment 122 to the anolyte compartment 124. Preventing additive migration to the anolyte compartment 124 prevents additive breakdown and contamination generally caused by additive contact with the anode 112. The membrane 120 may include an ion exchange membrane, such as a cation exchange membrane or an anion exchange membrane.

These membranes may be one of many commercially available membranes. For example, Tokuyama Corporation manufactures and supplies various hydrocarbon membranes for electrodialysis and related applications under the trade name "Neosepta." Perfluorinated cation membranes, which are stable to oxidation and useful for separating an insoluble anode from additives present in the catholyte solution, are generally available from DuPont Co as Nafion membranes N-117, N-450, or from Asahi Glass Company (Japan) under the trade name Flemion as Fx-50, F738, and F893 model membranes. Asahi Glass Company also produces a wide range of polystyrene based ion-exchange membranes under the trade name Selemion, which can be very effective for concentration/desalination of electrolytes and organic removal (cation membranes CMV, CMD, and CMT and anion membranes AMV, AMT, and AMD). There are also companies that manufacture similar ion-exchange membranes (Solvay (France), Sybron Chemical Inc. (USA), Ionics (USA), and FuMA-Tech (Germany) etc.).

In operation, the membrane 120 generally does not contact the anode 112. Contact with the anode 112 generally affects plating performance and anode 112 operation. Therefore, the membrane 120 is generally maintained at a distance from the anode 112 of greater than about 0.1 mm. Generally, the membrane 120 has a distance from the anode 112 of from about 0.5 mm to about 10 mm. The cathode 115 and anode 112 are electrically connected to a power supply (not shown). In a plating operation, the cathode substrate 114 has a negative charge so that copper ions in the plating solution (catholyte) are reduced at the cathode substrate 114 forming plated copper metal on the substrate 114 surface. As a result of the anode 112 being non-consumable, either the plating solution (catholyte) loop or the anolyte loop generally includes a metal supply, e.g., a cartridge with copper sulfate or copper oxide, to continually replenish the metal to be deposited on the substrate 114. The plating cell 102 additionally includes a manifold 116 disposed in the bottom of the plating cell 102 for expelling plating solution passing through the porous anode 112.

In certain embodiments, the plating cell 102 may further include a diffuser 118 disposed between the membrane 120 and the cathode 115. The flow diffuser 118 provides a substantially uniform vertical velocity of plating solution across the width of the plating cell 102 above the flow diffuser 118. The uniformity of plating conditions across the substrate 114 will therefore be enhanced due to the more uniform fluid flow conditions. The flow diffuser 118 is constructed to be substantially rigid. In this disclosure, the term "rigid" indicates sufficient structural rigidity of the diffuser to limit sufficient deformation or bending of the diffuser, under the normal operating conditions in the process cell, which would alter the electric resistance between the anode and a seed layer deposited on the substrate deposition surface. Such deformation would bend the diffuser 118 so the center of the diffuser 118 is nearer to the substrate 114 than the periphery of the diffuser 118. The flow diffuser 118 is preferably formed from microscopic, generally spherical, ceramic particles that are sintered together at the points of spherical contact. Ceramic is a naturally hydrophilic material. Other suitable, substantially rigid, materials may also be utilized. The diffuser 118 is designed with pores having dimensions of from about 0.1 microns to about 500 microns. Since the fluid flow resistance through a flow diffuser 118 is a function of the distance that the fluid travels through the flow diffuser 118, the vertical height of the diffuser 118 can be altered to provide desired fluid flow characteristics. For example, a thicker flow diffuser 118 with the same pore dimensions will provide an increased resistance to fluid flow through the flow diffuser 118 to provide a more restricted fluid flow through the flow diffuser 118 having similar pore dimensions. Restricting the flow results in more uniform solution flow across the width of the diffuser 118. Although one flow diffuser is described herein, any structure configured to provide uniform flow known to one skilled in the art may be used.

The plating cell 102 further includes an anode lid 130 configured to reduce oxygen transfer from the anode 112 to the substrate 114. The lid 130 extends substantially across the plating cell 102 cross-section, thereby preventing the free flow of plating solution near the anode 112. The lid 130 is generally formed of an insulating material, such as glass, ceramic, metal covered with an insulative coating, polymer or composite material and is generally positioned from the anode 112 a distance of from about 0.5 mm to about 20 cm.

The lid 130 further includes a top side and a bottom side with a plurality of uniformly distributed channels 132 formed therein. The channels 132 may be uniformly cylindrical channels having a diameter of from about 0.05 mm to about 2 mm. The channel diameter generally depends upon the flow rate of the solution that is circulating through the lid 130 and anolyte compartment. To prevent penetration of bubbles through these channels, the velocity of electrolyte in channels ($V_E$) should be high, e.g., at least higher then the rise velocity of bubbles ($V_B$). Generally, the $V_B$ value in aqueous solutions is about 20–30 cm/s. In particular, $V_E$=F/(N$\pi$R$^2$), where F is the electrolyte flow rate (in cm$^3$/s) through the channels, N is the number of channels, and R is the radius of a channel. Generally, the more channels in the lid, the larger their cross-section. Therefore, larger cross-section channels generally require higher flow rates to accomplish $V_E$>$V_B$. As a result, the plating solution generally flows through the channels 132 at a velocity of greater than about 20 cm/s to completely prevent oxygen penetration through the lid 130. Surprisingly, penetration becomes negligible even when the velocity is greater than about 10 cm/s. The channels 132 generally have a distance from the nearest channel of from about 0.2 mm to about 10 mm, depending on the desired channel diameter and flow through the lid 130.

The channels 132 are configured to pass plating solution from the anolyte inlet 104 to the anode 112 and prevent the passage of dissolved gas, such as oxygen, from the anode 112 to the substrate 114. The passage of gas is generally prevented as a result of the pressure of plating solution exerted above the anode lid 130. The anolyte inlet 104 is generally in communication with an anolyte reservoir 108. A pump 110 is generally positioned between the anolyte reservoir 108 and the plating cell 102 and is configured to deliver the anolyte to the plating cell 102 upon actuation thereof. The plating solution generally flows through the channels 132 at a velocity of greater than about 10 cm/s to prevent oxygen penetration through the lid 130. Generally, the velocity should be greater than about 20 cm/s. As a result of a high anolyte linear flow velocity, the cell 102 generally includes a membrane support 134 positioned above the membrane 120, which prevents membrane degradation resulting from the high anolyte velocity in comparison to the catholyte velocity. A continuous flow of anolyte is generally required for continuous electrical connectivity between the anode 112 and the substrate 114. Continuity of the anolyte flow, and therefore electrical connection, is generally necessary for uniform and continuous plating. As a result, the manifold 116 is configured to provide a greater outflow of plating solution from the area between the anode lid 130 and the anode 112 than the inflow of plating solution passing through the lid 130. For example, for 200 mm substrates, the flow through the lid 130 is about 4 to about 10 L/min. To ensure adequate electrical connectivity, the conductivity of the solution may be measured or the cell 102 may be monitored for a voltage drop. The conductivity may further be provided by a conductive electrolyte film, which generally forms over the surface of the anode 112 during operation.

When utilizing a membrane, the membrane 120 is generally configured to facilitate adequate electrical connectivity between the anode electrode 112 and the cathode electrode 115 through the electrode lid 130. For example, the membrane 120 generally is selected so as not to affect the pressure necessary to provide continuous electrolyte flow through the channels 132 in the lid 130, thereby facilitating the downward flow of electrolyte through the channels 132.

Figure 2A:
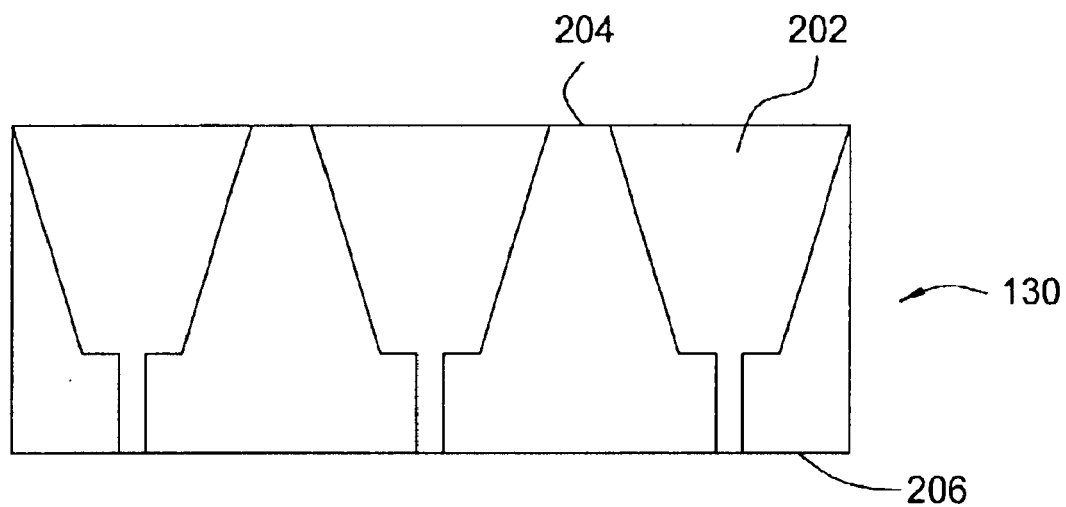
FIGS. 2A and 2B illustrate exemplary anode lid designs.
Figure 2B:
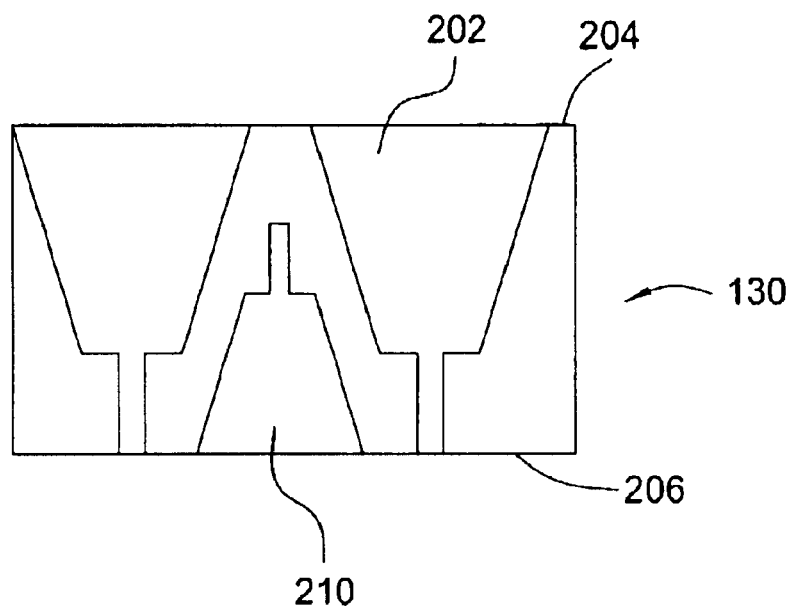

Alternatively, as shown in FIG. 2A, the lid channels 202 may include a portion of decreasing diameter, where the largest diameter is at the top side 204 of the lid 130 and a smaller diameter is in the middle or at the bottom side 206 of the lid 130. A uniform channel as described above may then connect the smaller diameter portion with the bottom side 206. For example, the smaller portion of the channel may have a diameter of from about 0.2 to about 3 mm and the larger diameter portion may have a diameter of from about 3 to about 15 mm. By providing a channel 202 having a decreasing diameter, the pressure of the anolyte required to provide the desired plating solution flowrate through the channel 202 is reduced. In addition, FIG. 2B illustrates additional openings 210 that may be formed in the bottom side 206 to collect and remove gas therein. As a result of the excess area for gas collection and removal, the minimum distance between the lid 130 and the anode 112 may be reduced.

In operation, the area between the lid 130 and the anode 112 is initially filled with air, gas evolved on the anode 112 and streams of electrolyte flowing through lid channels toward the anode 112. The air generally does not penetrate the channels 132 because the pressure resulting from the plating solution is generally sufficient to prevent upward migration of the oxygen gas. During plating, the plating solution passes through the channels 132 at a high flowrate and is therefore being supplied continuously through the plating solution inlet 104 to maintain the desired flowrate.

The anolyte residing in the area between the anode 112 and the lid 130 generally includes the dissolved gas, such as oxygen or nitrogen. Therefore, the anolyte is removed either through the manifold 116 or through the anolyte outlet 126 formed in the sidewall of the plating cell 102 to a separator 128 for separation. Upon separation, the recovered plating solution may be recirculated to the reservoir 108, and subsequently to the plating cell 102.

During plating operations, the application of the electrical plating bias between the anode and the cathode generally causes a chemical reaction on the anode, resulting in oxygen bubbles in the anolyte. However, the high anolyte velocity operates to minimize the anolyte residence time at the anode, thereby preventing oxygen saturation. Furthermore, the lid operates to prevent oxygen migration from the anode to either the membrane or the cathode as a result of the continuous high pressure flow of anolyte through the channels formed in the lid.

While the foregoing is directed to embodiments of the present invention, other and further embodiments of the invention may be devised without departing from the basic scope thereof, and the scope thereof is determined by the claims that follow.

What is claimed is:

1. An electrochemical cell, comprising:
   an anode electrode disposed in the electrochemical cell;
   a cathode electrode disposed opposite the anode electrode in the electrochemical cell; and
   an electrode lid positioned between the anode electrode and the cathode electrode having more than one aperture, the more than one aperture configured to fluidly interconnect the cathode electrode and the anode electrode, wherein the more than one aperture is configured to prevent the upward migration of dissolved gases.

2. An electrochemical cell, comprising:
   an anode electrode disposed in the electrochemical cell;
   a cathode electrode disposed opposite the anode electrode in the electrochemical cell; and
   an electrode lid positioned between the anode electrode and the cathode electrode having more than one aperture, the more than one aperture configured to fluidly interconnect the cathode electrode and the anode electrode, wherein each aperture comprises a first portion, the first portion having a decreasing diameter, wherein a larger diameter is proximate a top side of the electrode lid and a smaller diameter is connected to a second portion, the second portion having a substantially uniform diameter and being proximate a bottom side of the electrode lid.

3. An electrochemical cell, comprising:
   an anode electrode disposed in the electrochemical cell;
   a cathode electrode disposed opposite the anode electrode in the electrochemical cell;
   an electrode lid positioned between the anode electrode and the cathode electrode having more than one aperture, the more than one aperture configured to fluidly interconnect the cathode electrode and the anode electrode; and
   a manifold formed in a bottom wall of the electrochemical cell, the manifold being configured to provide a flow of electrolyte therethrough that is greater than the flow of electrolyte through the apertures.

4. An electrochemical cell, comprising:
   an anode electrode disposed in the electrochemical cell;
   a cathode electrode disposed opposite the anode electrode in the electrochemical cell;
   an electrode lid positioned between the anode electrode and the cathode electrode having more than one aperture, the more than one aperture configured to fluidly interconnect the cathode electrode and the anode electrode, wherein the electrochemical cell comprises a plating cell; and
   a membrane configured to separate the anode electrode from the cathode electrode and defining an anolyte compartment containing an anolyte solution and a catholyte compartment containing a catholyte solution.

5. The electrochemical cell of claim 4, further comprising a membrane support positioned above the membrane configured to prevent membrane degradation.

6. The electrochemical cell of claim 4, wherein the membrane is positioned a distance from the anode electrode of greater than about 0.1 cm.

7. The electrochemical cell of claim 4, wherein the membrane comprises a cation membrane selective to hydrogen ions and copper ions.

8. The electrochemical cell of claim 7, wherein the anolyte solution comprises copper sulfate in a concentration of from about 0.05 M to about 1.0 M and has a pH of from about 2 to about 6.

9. The electrochemical cell of claim 7, wherein the catholyte solution comprises copper sulfate, sulfuric acid, additives, and copper chloride in an amount of from about 20 ppm to about 80 ppm.

10. The electrochemical cell of claim 4, further comprising an anolyte outlet fawned in a sidewall of the electrochemical cell between the electrode lid and the anode electrode, the anolyte outlet in fluid communication with a separator configured to remove dissolved gases from the anolyte solution.

11. An electrochemical plating system, comprising:
    a plating cell having an anolyte compartment and a catholyte compartment, the anolyte compartment having an insoluble anode and an anolyte solution therein, the catholyte compartment having a cathode substrate support member and a catholyte solution therein;
    an ion-exchange membrane disposed between the anolyte compartment and the catholyte compartment; and
    an anode lid having more than one aperture fluidly interconnecting the insoluble anode and the cathode substrate support member, the apertures being configured to prevent the upward migration of dissolved gases.

12. The electrochemical plating system of claim 11, wherein the anode lid has a distance from the insoluble anode of between about 0.5 mm and about 20 cm.

13. The electrochemical plating system of claim 11, wherein each of the apertures have substantially the same diameter.

14. The electrochemical plating system of claim 11, wherein each of the apertures have a diameter of between about 0.05 mm and about 2 mm.

15. The electrochemical plating system of claim 11, wherein at least one of the apertures comprise a first portion and a second portion, the first portion having a decreasing diameter wherein a larger diameter is proximate a top side of the anode lid and a smaller diameter is operably connected to the second portion, the second portion having a substantially uniform diameter and being proximate a bottom side of the anode lid.

16. The electrochemical plating system of claim 11, wherein the anolyte solution passing through the apertures has a velocity of greater than about 10 cm/s.

17. The electrochemical plating system of claim 11, wherein the anolyte passing through the apertures has a velocity of greater than about 20 cm/s.

18. The electrochemical plating system of claim 11, wherein each of the apertures have a distance from another aperture of between about 0.2 mm and about 10 mm.

19. The electrochemical plating system of claim 11, further comprising a manifold formed in a bottom wall of the plating cell, the manifold being configured to provide a flow of anolyte solution therethrough that is greater than the flow of anolyte solution through the apertures.

20. The electrochemical plating system of claim 11, wherein the insoluble anode comprises at least one of titanium, platinum, niobium, iridium oxide, ruthenium oxide, and combinations thereof.

21. The electrochemical plating system of claim 11, further comprising a membrane support positioned above the membrane configured to prevent membrane degradation.

22. The electrochemical plating system of claim 11, wherein the membrane is positioned a distance above the insoluble anode of greater than about 0.1 cm.

23. The electrochemical plating system of claim 11, wherein the anolyte solution comprises copper sulfate in a concentration of from about 0.05 M to about 1.0 M and has a pH of from about 2 to about 6.

24. The electrochemical plating system of claim 11, wherein the catholyte solution comprises copper sulfate, sulfuric acid, additives, and copper chloride in an amount of from about 20 ppm to about 80 ppm.

25. The electrochemical plating cell of claim 11, further comprising an anolyte outlet formed in a sidewall of the plating cell between the anode lid and the insoluble anode, the anolyte outlet in fluid communication with a separator configured to remove dissolved gases from the anolyte solution.

26. A method for plating a metal onto a substrate, comprising:

supplying an electrolyte to a plating cell having an anode electrode, a cathode electrode disposed opposite the anode electrode and an electrode lid having more than one aperture positioned between the anode electrode and the cathode electrode, wherein supplying the electrolyte includes passing the electrolyte through the more than one aperture at a rate sufficient to prevent upward migration of dissolved gases; and applying an electrical bias to the plating cell to plate a metal from the electrolyte onto the substrate.

27. The method of claim 26, wherein supplying the electrolyte to the plating cell includes passing the electrolyte through the more than one aperture at a rate sufficient to provide electrical continuity between the cathode electrode and the anode electrode.

28. The method of claim 26, wherein the anode electrode is insoluble.

29. The method of claim 26, wherein the electrode lid is positioned between about 0.5 mm and about 20 cm from the anode electrode.

* * * * *

UNITED STATES PATENT AND TRADEMARK OFFICE
CERTIFICATE OF CORRECTION

PATENT NO.        : 6,852,209 B2                              Page 1 of 1
APPLICATION NO. : 10/263563
DATED             : February 8, 2005
INVENTOR(S)       : Nicolay Kovarsky It is certified that error appears in the above-identified patent and that said Letters Patent is hereby corrected as shown below:

<u>In the Claims</u>

Column 8, Claim 10, Line 41: Change "fawned" to --formed--

Signed and Sealed this

Fifteenth Day of August, 2006

JON W. DUDAS
*Director of the United States Patent and Trademark Office*